(12) United States Patent
Kobayashi

(10) Patent No.: US 6,686,063 B2
(45) Date of Patent: Feb. 3, 2004

(54) ORGANIC ELECTROLUMINESCENT DEVICE, METHOD FOR MANUFACTURING ORGANIC ELECTROLUMINESCENT DEVICE, AND ELECTRONIC APPARATUS

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 24 days.

(21) Appl. No.: 09/962,460

(22) Filed: Sep. 26, 2001

(65) Prior Publication Data

US 2002/0068191 A1 Jun. 6, 2002

(30) Foreign Application Priority Data

Sep. 27, 2000 (JP) ......................... 2000-294332
Sep. 25, 2001 (JP) ......................... 2001-292643

(51) Int. Cl.$^7$ ............................................. H05B 33/00
(52) U.S. Cl. ................. 428/690; 428/917; 313/512; 257/99; 257/100; 156/67; 427/66
(58) Field of Search ................. 428/690, 917, 428/68, 76; 313/504, 512; 257/99, 100; 156/67; 427/66

(56) References Cited

U.S. PATENT DOCUMENTS 4,213,074 A * 7/1980 Kawaguchi et al. ........ 313/509
5,189,405 A * 2/1993 Yamashita et al. .......... 340/781
5,882,761 A * 3/1999 Kawami et al. ............. 428/69
6,284,342 B1 * 9/2001 Ebisawa et al. ............. 428/69
6,537,688 B2 * 3/2003 Silvernail et al. ........... 428/690
6,576,351 B2 * 6/2003 Silvernail ................... 428/690

FOREIGN PATENT DOCUMENTS

| JP | A-5-89959 | 4/1993 |
| JP | A-5-182759 | 7/1993 |
| JP | A-8-236273 | 9/1996 |
| JP | A-10-275682 | 10/1998 |
| JP | A-2000-58255 | 2/2000 |

* cited by examiner

Primary Examiner—Cynthia H. Kelly
Assistant Examiner—Dawn Garrett
(74) Attorney, Agent, or Firm—Oliff & Berridge, PLC

(57) ABSTRACT

By providing a laminate forming an organic EL element on a glass substrate, and by forming a sealing layer composed of an epoxy resin and a protective glass plate on the laminate, a main body of an organic EL panel is formed. All end faces and peripheries of the main body are covered by a cover member made of an aluminum plate, and a space between the cover member and the main body is filled with a filling material composed of an epoxy resin mixed with a deoxidizer.

15 Claims, 6 Drawing Sheets

ORGANIC ELECTROLUMINESCENT DEVICE, METHOD FOR MANUFACTURING ORGANIC ELECTROLUMINESCENT DEVICE, AND ELECTRONIC APPARATUS

TECHNICAL FIELD

The present invention relates to organic electroluminescent (hereinafter referred to as "EL") devices and electronic apparatuses. As the applications of the organic EL devices, there may be mentioned display devices of information terminal apparatuses such as a computer, a mobile phone, and a television, and backlights of a liquid crystal display device.

BACKGROUND ART

Organic EL elements are self-luminous devices having a structure formed of an organic light-emitting layer provided between a cathode and an anode. An organic EL panel is composed of a laminate which forms this organic EL element and which is provided on a substrate, and as the structure thereof, for example, there may be mentioned a thin-film laminate structure formed of a thin-film (anode layer) composed of a transparent and conductive material, an organic light-emitting layer composed of an organic thin-film, and a metal thin-film (cathode layer) laminated to each other in that order on a transparent substrate. In addition, when necessary, a hole injection/transport layer is provided on the anode layer side of the organic light-emitting layer, and an electron injection/transport layer is provided on the cathode layer side of the light-emitting layer.

In this organic EL panel described above, since the laminate forming the organic EL element is easily degraded by moisture, for example, various sealing methods have been proposed.

For example, Japanese Unexamined Patent Application Publication Nos. 5-182759 and 8-236273 disclose an organic EL panel comprising a laminate, which forms the organic EL panel, provided on one surface of a substrate, a sealing layer, which is composed of a synthetic resin, provided on end faces and the surface (surface at the side opposite to the substrate) of the laminate, and a protection plate material fixed on the surface opposite to the laminate of the sealing layer.

Japanese Unexamined Patent Application Publication No. 5-89959 discloses that a protection layer (for example, a thin-film composed of a metal oxide such as MgO formed by reactive deposition) composed of an electrically insulating inorganic compound is provided on an external surface of the laminate described above, and a sealing layer composed of a glass plate, for instance, is further provided outside this protection layer. Japanese Unexamined Patent Application Publication No. 10-275682 discloses that a protection layer formed of a fluorinated polymer or an insulating oxide is formed on the external surface of the laminate described above, the outside of the protection layer is further covered by a glass container, the space between the protection layer and the glass container is filled with an inert medium, and a dehydrating agent and an oxygen absorbent are further contained in this inert medium.

Japanese Unexamined Patent Application Publication No. 2000-58255 discloses that a drive/control circuit for an organic EL element is provided at the periphery of a substrate at which the laminate described above is not formed, the laminate is sealed by a sealing plate, and a plate-shaped protection member composed of aluminum, copper, or iron covers the area at which the circuit is formed. This protection member covers external surfaces of the circuit and the end faces of the substrate at which the circuit is formed, a resin layer is provided between the protection member and the external surfaces of the circuit, and nothing is provided between the protection member and the end faces of the substrate.

SUMMARY

An organic electroluminescent device of the present invention is an organic electroluminescent device comprising at least a first electrode, a light-emitting layer, and a second electrode between a substrate and a protection member, in which a cover member having a gas barrier property is disposed at end faces of the substrate so as to cover a part of the substrate and a part of the protection member.

A method for manufacturing an organic electroluminescent device according to the present invention is a method for manufacturing an organic electroluminescent device which comprises at least a first electrode, a light-emitting layer, and a second electrode formed between a substrate and a protection member, in which the method comprises a step of forming at least a first electrode, a light-emitting layer, and a second electrode on the substrate, a step of attaching the substrate and the protection member to each other; and a step of disposing a cover member having a gas barrier property at end faces of the substrate so that the cover member covers a part of the substrate and a part of the protection member.

In an electronic apparatus of the present invention comprising an organic electroluminescent device, the organic electroluminescent device comprises at least a first electrode, a light-emitting layer, and a second electrode between a substrate and a protection member; and a cover member which has a gas barrier property and which is disposed at end faces of the substrate so that the cover member covers a part of the substrate and a part of the protection member.

BRIEF DESCRIPTIONS OF THE DRAWINGS

Figure 3:
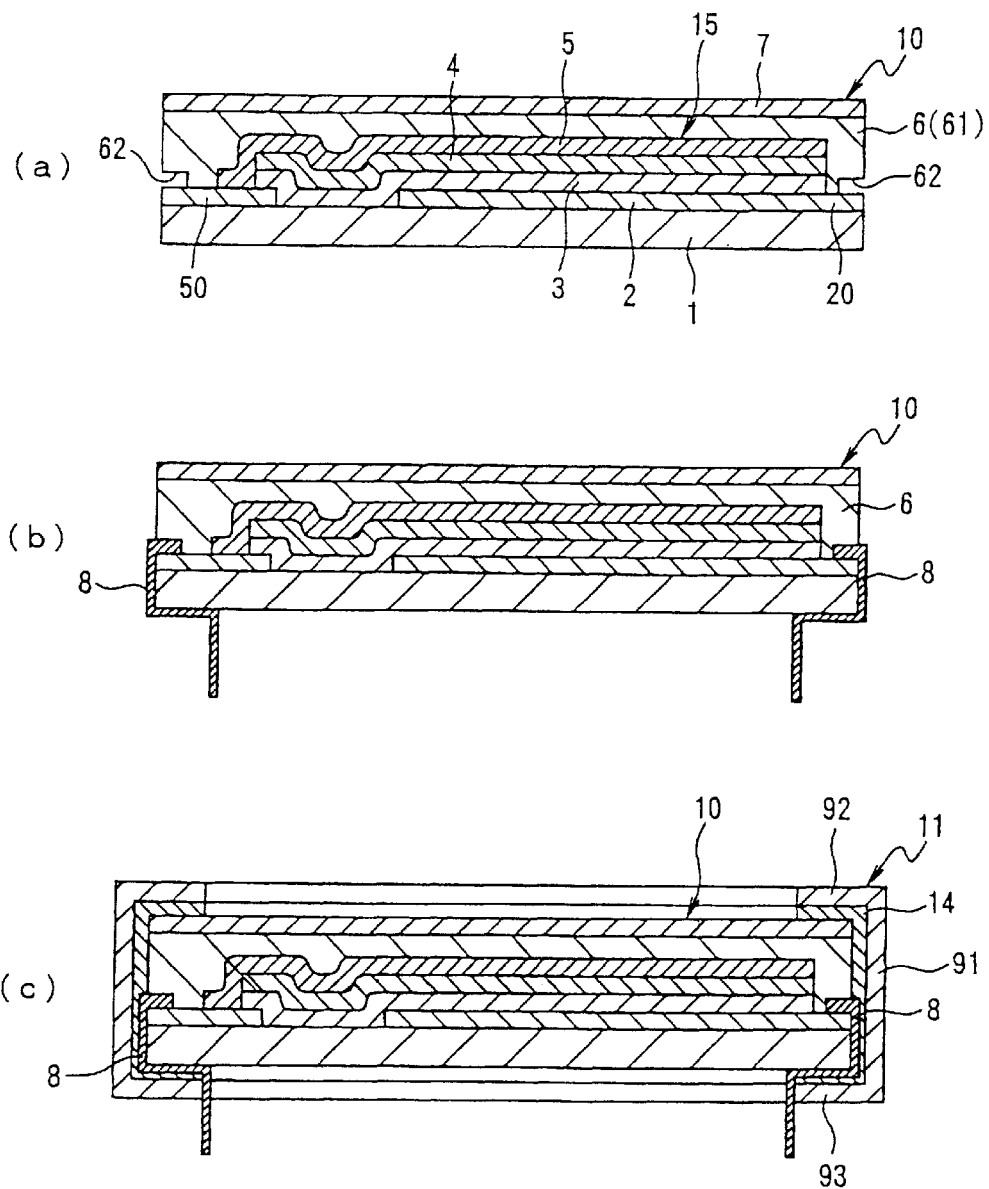

FIG. 3 includes cross-sectional views for illustrating a method for manufacturing the organic EL panel of the first embodiment.

Figure 4:
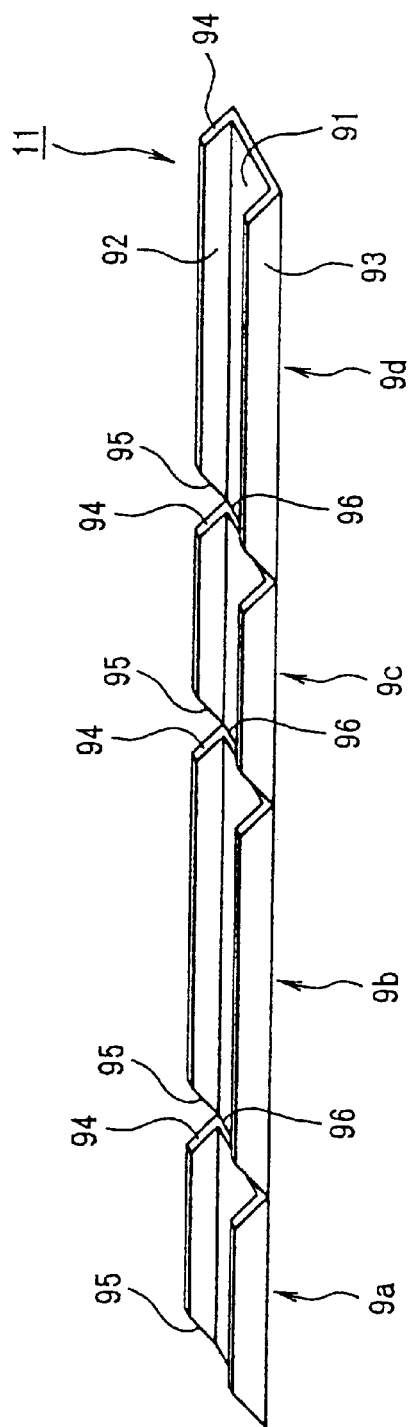

FIG. 4 is a perspective view showing a cover member used in the first embodiment.

Figure 5:
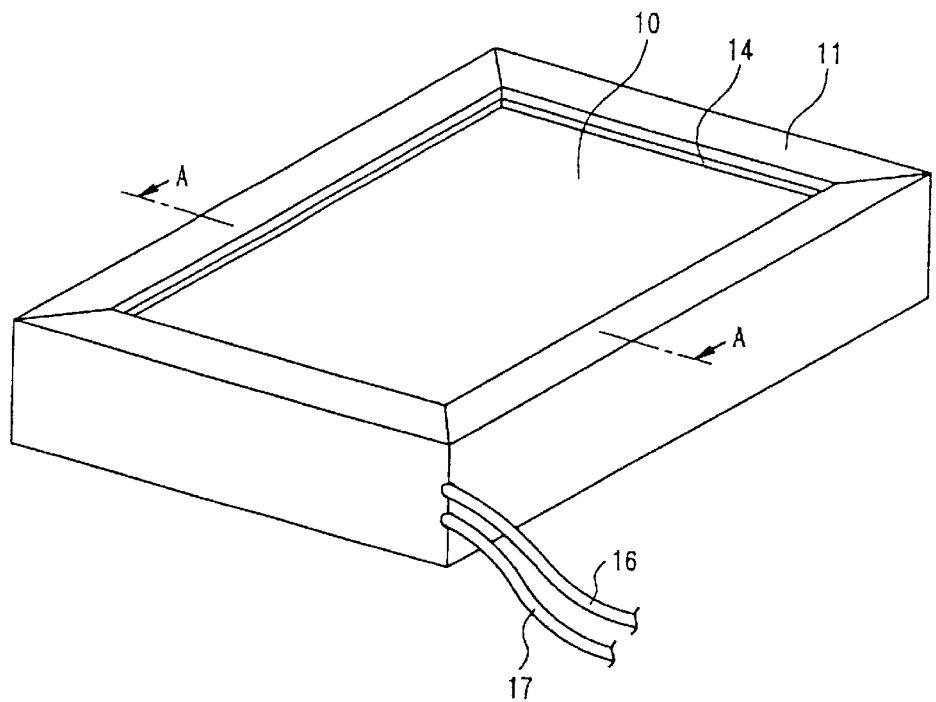

FIG. 5 is a perspective view showing an organic EL panel of a second embodiment.

Figure 6:
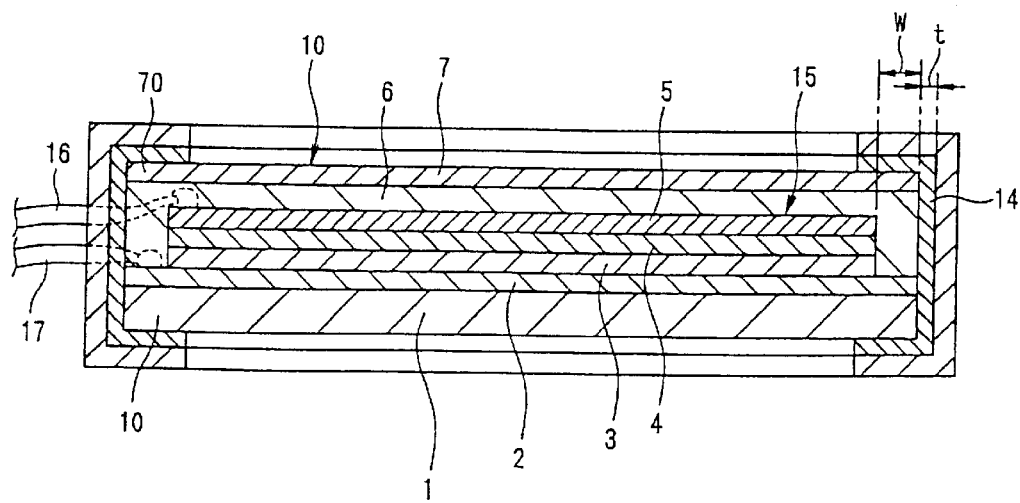

FIG. 6 is a cross-sectional view of the organic EL panel of the second embodiment and corresponds to a cross-sectional view taken along the line A—A in FIG. 5.

Figure 7:
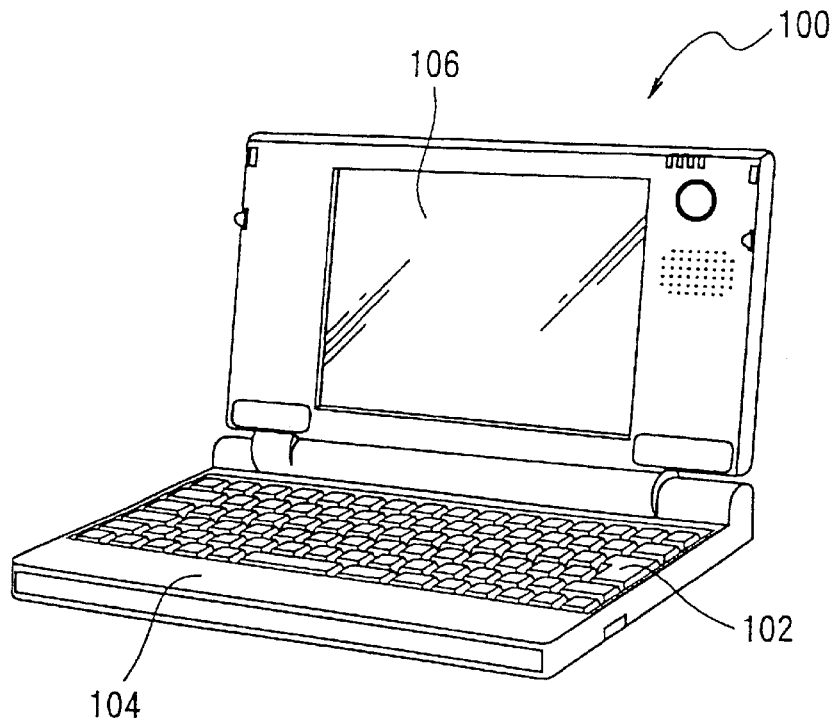

FIG. 7 is a perspective view of the structure of a personal computer corresponding to an example of an electronic apparatus to which an organic EL panel of the present invention is applied.

Figure 8:
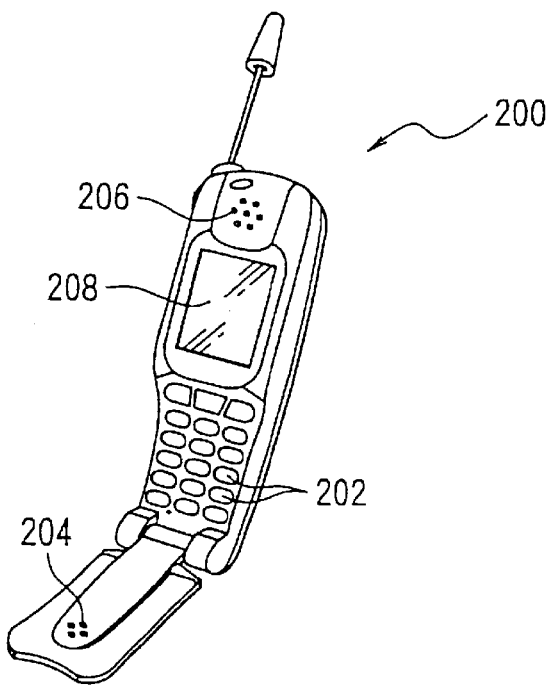

FIG. 8 is a perspective view of the structure of a mobile phone corresponding to an example of an electronic apparatus to which an organic EL panel of the present invention is applied.

Figure 9:
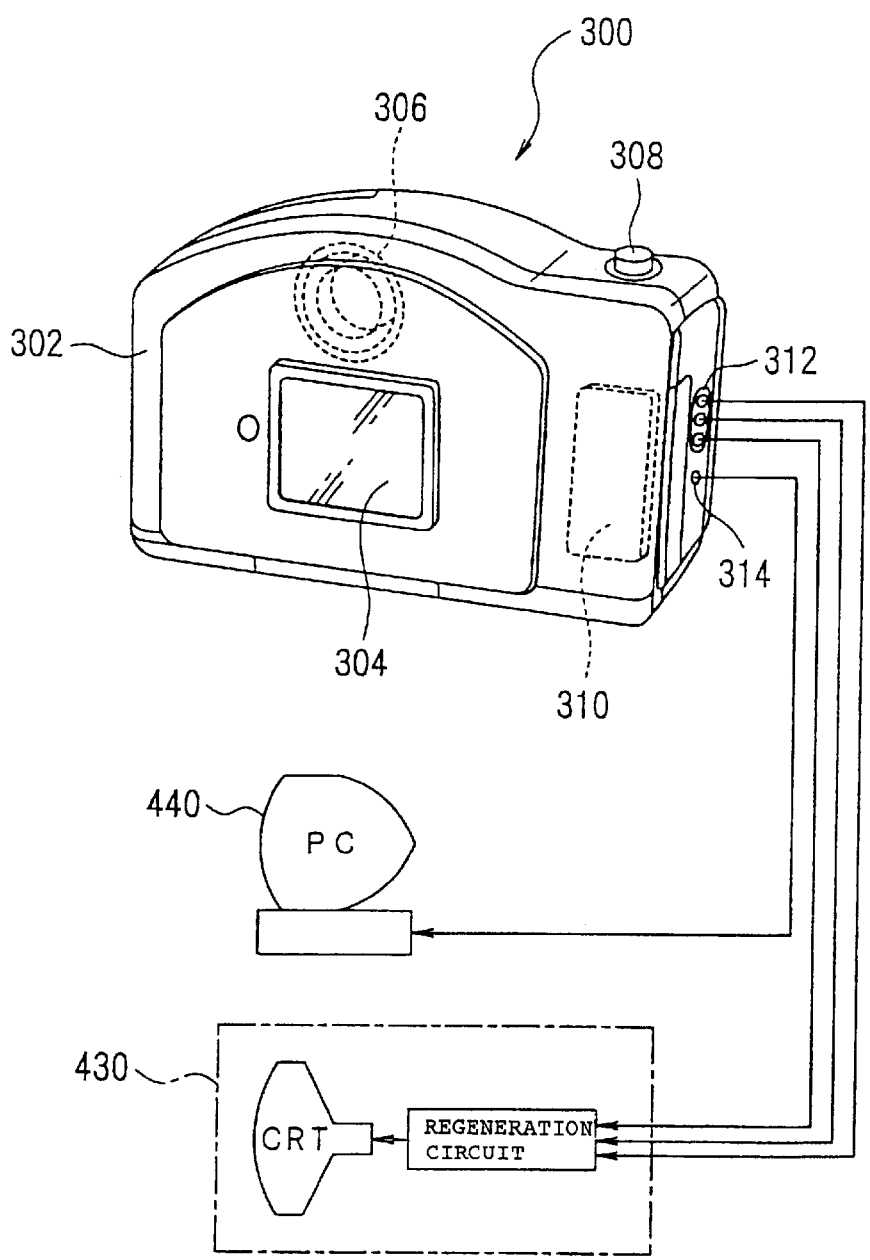

FIG. 9 is a perspective view of the structure of the rear side of a digital still camera corresponding to an example of an electronic apparatus to which an organic EL panel of the present invention is applied.

DETAILED DESCRIPTION

Among conventional sealing methods described above, in order to obtain a sufficient sealing performance at end faces by a method for sealing the end faces of a laminate (structure including an organic EL element) forming the organic EL element with a resin layer, the width of the resin layer must be increased.

However, in the application to a mobile phone in which the area for mounting a display panel is small, since the distance between the end face of the substrate and the display region must be decreased (for example, to 2 mm or less), it has been required that the width of the synthetic resin layer provided on the end face of the laminate be reduced to as small as possible. In addition, even when a sufficient amount of a sealing material such as a synthetic resin layer is provided, it is necessary to lengthen the path through which moisture or oxygen penetrates from the outside.

In a method for sealing an organic EL panel having a structure which includes an organic EL element and which is provided on a substrate, an object of the present invention is to provide a sufficient sealing performance even when the width of a synthetic resin layer provided on end faces of the structure is extremely decreased. In addition, an object is to provide a further improved sealing performance even when a sufficient amount of a sealing member such as a synthetic resin layer is provided.

(1) In an organic electroluminescent device of the present invention comprising at least a first electrode, a light-emitting layer, and a second electrode between a substrate and a protection member, a cover member having a gas barrier property is disposed at end faces of the substrate so as to cover a part of the substrate and a part of the protection member.

According to the present invention, since the cover member having the gas barrier property holds the substrate and the protection member, the sealing performance is improved, thereby preventing deterioration of the light-emitting layer due to moisture and oxygen penetrating from the outside.

(2) In this organic electroluminescent device, the cover member may be disposed with a filling material which has a gas barrier property.

(3) In this organic electroluminescent device, the filling material may comprise an absorbent.

(4) In this organic electroluminescent device, the filling material may comprise a deoxidizer.

(5) This organic electroluminescent device may further comprise a sealing layer formed between the substrate and the protection member, wherein the sealing layer may be disposed so as to be in contact with the filling material.

(6) This organic electroluminescent device may further comprise a first terminal which is provided on the substrate and is connected to the first electrode; and a first conductive member that supplies electric power to the first electrode and is connected to the first terminal; wherein a part of the first conductive member may be disposed between an end face of the substrate and the cover member.

(7) This organic electroluminescent device may further comprise a second terminal which is provided on the substrate and is connected to the second electrode; and a second conductive member that supplies electric power to the second electrode and is connected to the second terminal; wherein a part of the second conductive member may be disposed between the end face of the substrate and the cover member.

(8) This organic electroluminescent device may further comprise a first wire for supplying electric power to the first electrode and a second wire for supplying electric power to the second electrode; and holes formed in the cover member; wherein the first wire and the second wire may be disposed so as to pass through the holes.

(9) The cover member may comprise a metal plate.

(10) A method for manufacturing an organic electroluminescent device according to the present invention is a method for manufacturing an organic electroluminescent device having at least a first electrode, a light-emitting layer, and a second electrode formed between a substrate and a protection member. The method described above comprises a step of forming at least the first electrode, the light-emitting layer, and the second electrode on the substrate;

a step of attaching the substrate and the protection member to each other; and a step of disposing a cover member having a gas barrier property at end faces of the substrate so that the cover member covers a part of the substrate and a part of the protection member.

(11) This method for manufacturing the organic electroluminescent device may further comprise a step of providing a filling material having a gas barrier property between the cover member and end faces of the substrate.

(12) This method for manufacturing the organic electroluminescent device may further comprise a step of providing a material to be used as the filling material on the cover member beforehand; wherein the cover member may be disposed so that the material opposes end faces of the substrate.

(13) This method for manufacturing the organic electroluminescent device may further comprise a step of forming a sealing layer between the substrate and the protection member and at least on the periphery of the substrate; wherein the cover member may be disposed so that the filling material comes into contact with the sealing layer.

(14) This method for manufacturing the organic electroluminescent device may further comprise a step of forming on the substrate a first terminal connected to the first electrode; and a step of connecting to the first terminal a first conductive member for supplying electric power to the first electrode; wherein the first conductive member may be provided between an end face of the substrate and the cover member while a part of the first conductive member is being bent.

(15) An electronic apparatus of the present invention comprises an organic electroluminescent device, in which the organic electroluminescent device comprises at least a first electrode, a light-emitting layer, and a second electrode between a substrate and a protection layer; and a cover member having a gas barrier property disposed at end faces of the substrate so that the cover member covers a part of the substrate and a part of the protection member.

Hereinafter, preferable embodiments of the present invention will be described with reference to the drawings.

Figure 1:
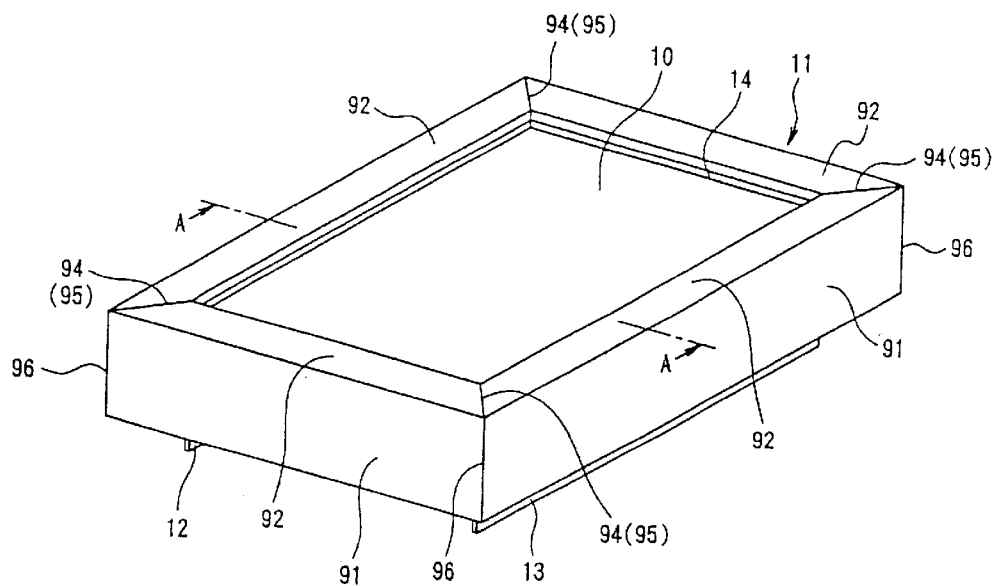
FIG. 1 is a perspective view showing an organic EL panel of a first embodiment.
Figure 2:
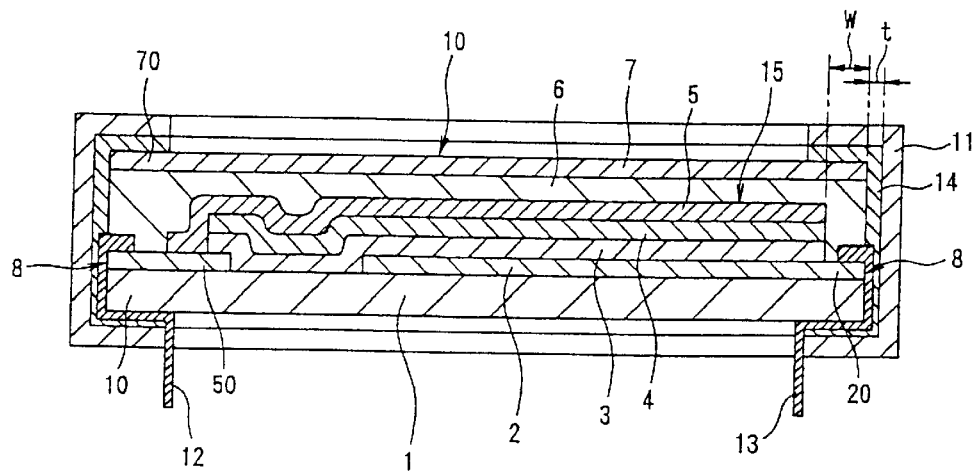
FIG. 2 is a cross-sectional view of the organic EL panel of the first embodiment and corresponds to a cross-sectional view taken along the line A—A in FIG. 1.

Referring to FIGS. 1 to 4, an organic EL panel (organic EL device) corresponding to a first embodiment of the present invention will be described. FIG. 1 is a perspective view showing the organic EL panel of the first embodiment. FIG. 2 is a cross-sectional view showing the organic EL panel of the first embodiment and corresponds to a cross-sectional view taken along the line A—A in FIG. 1. FIG. 3 includes cross-sectional views for illustrating a method for manufacturing the organic EL panel of the first embodiment. FIG. 4 is a perspective view showing a cover member used in the first embodiment.

As shown in FIG. 1, this organic EL panel is composed of a main body 10 of the organic EL panel, a cover member 11, and external terminals 12 and 13. The cover member 11 is fixed to the main body 10 by a filling material 14.

As shown in FIG. 2, the main body 10 is composed of a glass substrate 1, a laminate (structure including an organic EL element) 15 forming the organic EL element, a sealing layer 6, and a protective glass plate 7. The laminate 15 is formed on one surface of the glass substrate 1 and is composed of an anode layer (first electrode) 2, a hole injection layer 3, an organic light-emitting layer 4, and a cathode layer (second electrode) 5 in that order from the substrate side. In addition, an internal terminal (second terminal) 50 for the cathode layer 5 is formed on the substrate 1, a conductive tape 8 is connected to this internal terminal 5, and the front end of the conductive tape is extended to the outside to be used as an external terminal 12 for the cathode. In addition, one end portion 20 of the anode layer 2 functions as an internal terminal (first terminal), a conductive tape 8 is connected to the end portion 20, and the front end of the conductive tape 8 is extended to the outside to be used as an external terminal 13 for the anode. By applying electric power to the cathode layer 2 and the anode layer 5 via the conductive tapes 8, light emission can be obtained.

The glass substrate 1 is a soda glass 0.7 mm thick, and the protective glass plate 7 is a 0.1 mm thick soda glass. The anode layer 2 and the internal terminal 50 are each formed of a 150 nm thick ITO ($In_2O_3$—$SnO_2$) thin-film, and the hole injection layer 3 is a 100 nm thick film formed by firing "Baytron (registered trademark of Bayer AG)". The organic light-emitting layer 4 is composed of a poly(dioctyl fluorene) film 70 nm thick, and the cathode layer 5 is composed of a calcium thin-film 20 nm thick and an aluminum thin-film 400 nm thick.

On all the end faces and the entire surface opposite to the substrate side (side opposite to the glass substrate 1 side) of the laminate 15, a sealing layer 6 composed of an epoxy resin is formed. The protective glass plate 7 is fixed on the surface opposite to the substrate of the sealing layer 6.

The cover member 11 is composed of an aluminum plate. The cover member is not limited thereto as long as it has a gas barrier property, and for example, iron or stainless steel may also be used. The definition of "gas barrier property" is a property which does not allow at least an oxygen gas or water vapor to pass through. All the end faces and all peripheral portions (peripheral portion 70 of the surface of the protective glass plate 7 and peripheral portion 10 of the surface of the glass substrate 1) of the main body 10 are covered by this cover member 11 with the conductive tapes 8 provided therebetween at the glass substrate 1 side. The filling material 14 is formed of an epoxy resin and a deoxidizer mixed therewith. This filling material 14 is encapsulated between the cover member 11 and the main body 10 with the conductive tapes 8 provided therebetween at the glass substrate 1 side.

This organic EL panel can be manufactured by, for example, the method shown in FIG. 3.

First, on the glass substrate 1, the anode layer 2, the internal terminal 50, the hole injection layer 3, the organic light-emitting layer 4, and the cathode layer 5 are formed in that order so as to have the structure described above. As shown in FIG. 3(a), the cathode layer 5 is formed as a continuous film on the organic light-emitting layer 4 and the internal terminal 50. That is, in accordance with a known method, the laminate 15 forming the organic EL element is formed on the glass substrate 1.

Next, a thermosetting epoxy-based adhesive is applied to this glass substrate 1, so that an adhesive layer 61 is formed on the entire upper surface and all end faces of the laminate 15. Subsequently, after the protective glass plate 7 is placed on this adhesive layer 6, the adhesive layer 61 is cured. As a result, the sealing layer 6 composed of the epoxy resin is formed on the entire upper surface and all the end faces of the laminate 15, and the protective glass plate 7 is fixed on the upper surface of the sealing layer 6.

In order to form mounting grooves 62 for mounting conductive tapes 8 at positions on the internal terminals 20 and 50, removable spacers are placed at the above-mentioned positions before the adhesive is applied, and these spacers are removed after curing is performed. Accordingly, the mounting grooves 62 are formed at the above-mentioned positions on the sealing layer 6. The state described above is shown in FIG. 3(a).

Next, ends of conductive tapes 8 are inserted in the mounting grooves 62 so as to come contact with the upper surfaces (surfaces opposite to the substrate) of the internal terminal 20 and 50, respectively; and end faces of the internal terminals 20 and 50, end faces of the glass substrate 1 continued therefrom, and rear surfaces (surfaces opposite to that on which the laminate 15 is formed) of the periphery of the glass substrate 1, which are continued from the end faces of the glass substrate 1, are covered with the conductive tapes 8 so as to be in contact therebetween; and the other ends of conductive tapes 8 are bent at right angles with respect to the surface of the substrate. As described above, the conductive tapes 8 are brought into contact with the main body 10 and are bonded to these contact portions by applying heat and pressure, whereby the conductive tapes 8 can be fixed to the main body 10. FIG. 3(b) shows the state described above.

Next, a cover member 11 having the structure shown in FIG. 4 is prepared. This cover member 11 is composed of four unit members 9a to 9d, and the unit members 9a to 9d each comprise an end face member 91 which covers each associated end face of the main body 10, and the peripheral members 92 and 93 which cover the peripheral portions of the surface of the glass substrate 1 and the surface of the protective glass substrate 7 of the main body 10. The peripheral members 92 and 93 are formed at both ends of the end face member 91 in the width direction so as to be perpendicular to the end face member 91. Two end faces 94 and 95 of each of the unit members 9a to 9d in the longitudinal direction are formed so as to be inclined by 45° with respect to the end face member 91. The unit members 9a to 9d are allowed to be bent while coupled with each other at folding lines 96.

Next, an uncured material of the filling material 14 is applied to the inside (area enclosed by the end faces members 91, the peripheral members 92, and the peripheral members 93 of all of the unit members 9a to 9d) of the cover member 11, the surfaces coated with the uncured material are positioned towards the main body 10 side, and all the end faces and the peripheral portions of the main body 10 are covered by the cover member 11 with the uncured material of the filling material 14 provided therebetween (the glass substrate 1 side is covered by the cover member with the conductive tapes 8 further provided therebetween) while the unit members 9a to 9d are being folded at the folding lines 96 so that the end faces 94 and 95 of the individual unit members 9a to 9d are brought into contact with each other as shown in FIG. 1. Subsequently, the uncured material of the filling material 14 is cured.

According to the organic EL panel of this embodiment, when an aluminum cover member 11 having a plate thickness of 0.5 mm, the end face member 91 of a 1.0 mm width, the peripheral members 92 and 93 of respectively a 2.0 mm width, was formed, and when an epoxy-based adhesive mixed with a powdered deoxidizer sold under the registered trademark "Ageless" of Mitsubishi Chemical Corp. was used so that the thickness (reference label t in FIG. 2) of the filling material 14 was 0.4 mm, it was confirmed that sufficient sealing performance could be obtained even if the width W of the sealing layer 8 formed of an epoxy resin was 1.0 to 2.0 mm at the end face of the laminate 15.

The sufficient sealing performance mentioned above means that when an organic EL panel, which was held at 60° C., a humidity of 95%, and an atmospheric pressure for 500 hours, is driven, deterioration of the light-emission properties does not occur at the peripheral portion of the light-emitting region.

In addition, in an organic EL panel having the same structure as that described above except that an epoxy-based adhesive mixed with powdered magnesium oxide (absorbent) was used as a material for the filling material 14, even when the width W of the sealing layer 8 composed of an epoxy resin was 1.0 to 2.0 mm at the end face of the laminate 15, it was confirmed that sufficient sealing performance could be obtained.

An organic EL panel (organic EL device) according to a second embodiment of the present invention is shown in FIGS. 5 and 6. FIG. 5 is a perspective view of the organic EL panel of the second embodiment. FIG. 6 is a cross-sectional view of the organic EL panel of the second embodiment and corresponds to a cross-sectional view taken along the line A—A in FIG. 5.

As shown in these figures, this organic EL panel is composed of the main body 10 forming the organic EL panel, the cover member 11, and wires 16 and 17. The cover member 11 is fixed to the main body 10 by the filling material 14. That is, in place of the conductive tapes 8 used as the external terminals 12 and 13 in the first embodiment, the organic EL panel of the second embodiment is provided with the wires 16 and 17.

Accordingly, after the laminate 15 is formed, a base end of the wire 16 used for the cathode and a base end of the wire 17 for the anode are soldered on the corner portion of the upper surface of the cathode layer 5 and on the corner portion of the upper surface of the anode layer 2, respectively, and subsequently, the sealing layer 6 is formed.

In addition, used as a cover member 11 are the end face 94 of the a unit member 9a and the end face 95 of the unit member 9d that include cutouts for holes where the wires 16 and 17 pass through. Accordingly, when the cover member 11 covers the main body 10, and the end face 94 of the unit member 9a and the end face 95 of the unit member 9d are brought into contact with each other, the holes through which the wires 16 and 17 will be placed are formed by the cutouts of the individual unit members 9a and 9d. Accordingly, when the main body 10 is covered by the cover member 11 while the wires 16 and 17 are moved to the positions at which the end face 94 of the unit member 9a and the end face 95 of the unit member 9d come into contact with each other, the base ends of the wires 16 and 17 are placed in the holes formed of both cutaways, and the front ends of the wires are disposed outside the cover member 11.

In addition, since the organic EL panel of the second embodiment is used as a backlight, the anode layer 2 is not patterned.

The organic EL panel of the second embodiment has the same structure as that of the first embodiment except that the points described above.

In the case of the organic EL panel of the second embodiment, when an aluminum cover member 11 having a plate thickness of 0.5 mm, the end face member 91 of a 1.0 mm width, the peripheral members 92 and 93 of respectively a 2.0 mm width, was also used, and when an epoxy-based adhesive mixed with a powdered deoxidizer sold under the registered trademark "Ageless" of Mitsubishi Chemical Corp. was used so that the thickness (reference label t in FIG. 6) of the filling material 14 was 0.4 mm, it was confirmed that sufficient sealing performance could be obtained even if the width W of the sealing layer 8 formed of an epoxy resin was 1.0 to 2.0 mm at the end face of the laminate 15.

In addition, in an organic EL panel having the same structure as that described in the second embodiment except that an epoxy-based adhesive mixed with powdered magnesium oxide (absorbent) was used as a material for the filling material 14, even when the width W of the sealing layer 8 composed of an epoxy resin is 1.0 to 2.0 mm at the end face of the laminate 15, it was confirmed that sufficient sealing performance could be obtained.

In the structures of the embodiments described above, when a cavity is formed in the peripheral portion of the protective glass plate 7 at the sealing layer 6 side, and a deoxidizer and/or a absorbent (dehydrating agent) are provided in the cavity, the sealing performance at the end face side of the substrate can be further improved.

In the embodiments described above, the cover member 11 having the structure shown in FIG. 4 is used; however, the cover member which can be used in the present invention is not limited thereto. As long as the cover member has a structure which covers the periphery of the main body 10, any type of cover member may be used, and for example, a cover member having the structure approximately equal to that shown in FIG. 4 except that both end faces 94 and 95 of the unit members 9a to 9d are formed to have 90° with respect to the end face member 91, may be used. When all of the end faces and the all peripheral portions of the main body 10 are covered by this cover member while the unit members 9a to 9d are being folded at the folding lines 96, the peripheral members 92 and 93 adjacent to each other in the longitudinal direction of the unit members 9a to 9d are superposed on each other, respectively.

Even when the organic EL panel is an active matrix drive display panel, the structure of the embodiments of the present invention can be applied thereto, and in such a case, the anode layer 2 is patterned in a matrix corresponding to pixels, and a TFT element corresponding to each pixel is formed on the glass substrate 1.

Furthermore, the organic EL panel of the present invention may be applied to various electronic apparatuses, such as a mobile personal computer, a mobile phone, and a digital still camera.

FIG. 7 is a perspective view showing the structure of a mobile personal computer.

In FIG. 7, a personal computer 100 has a structure composed of a main body 104 provided with a keyboard 102 and a display unit 106 formed of the organic EL panel of the present invention.

FIG. 8 is a perspective view of a mobile phone. In FIG. 8, a mobile phone 200 comprises, in addition to a plurality of operation buttons 202, an ear piece 204, a mouthpiece 206, and a display panel 208 formed of the organic EL panel of the present invention.

FIG. 9 is a perspective view showing the structure of a digital still camera 300. In the figure, the connection with external apparatuses is also briefly shown. Compared to a typical camera which exposes a film using an optical image of an object, the digital still camera 300 produces image signals by performing photoelectric conversion of an optical image of an object using an imaging element such as a CCD (Charged Coupled Device).

A display panel 304 composed of the organic EL panel of the present invention is provided on the back surface of a case 302 of the digital still camera 300, and the structure is formed so as to allow display to be performed in accordance with the image signals provided from the CCD. Accordingly, the display panel 304 serves as a viewfinder for displaying the object. In addition, a light-receiving unit 306 containing, for example, an optical lens or the CCD is provided on an observing side (the back surface side in the figure) 302.

When a picture taker views an object image displayed on the display panel 304 and then presses a shutter button 308, an image signal of the CCD at that time is transferred to and stored in a memory of a circuit substrate 310. In addition, in this digital still camera 300, a video signal output terminal 312 and an input/output terminal 314 for data communication are provided on the side surface of the case 302.

In addition, as shown in the figure, when it is necessary, a television monitor 430 and a personal computer 440 are connected to the video signal output terminal 312 and the input/output terminal 314 for data communication, respectively. Furthermore, the structure is formed so that the image signal stored in the memory of the circuit substrate 310 is output on the television monitor 430 or to the personal computer 440 by a predetermined operation.

As an electronic apparatus to which the organic EL panel of the present invention can be applied as a display unit, in addition to the personal computer shown in FIG. 7, the mobile phone shown in FIG. 8, and the digital still camera shown in FIG. 9, there may be mentioned a television, a viewfinder type and a direct viewing video tape recorder, a car navigation apparatus, a pager, an electronic notebook, an electronic calculator, a word processor, a workstation, a television phone, a POS terminal, and an apparatus provided with a touch panel.

As has thus been described, according to the organic EL device of the present invention, even when a sealing layer which is composed of a synthetic resin and has a very small width is provided at end faces of a structure including the organic EL element, sufficient sealing performance can be obtained.

As a result, since the distance between the end face of the substrate and the display area can be decreased (for example, to 2 mm or less), the organic EL device of the present invention is preferably used as a display panel of a mobile phone, for example, with a small area on which the display panel is mounted.

In addition, according to the method of the present invention, the organic el device of the present invention can easily be obtained.

What is claimed is:

1. An organic electroluminescent device, comprising:
    a substrate;
    a protection member;
    a laminate comprising a first electrode, a light-emitting layer, and a second electrode, the laminate being disposed between the substrate and the protection member; and
    a cover member which has a gas barrier property and covers at least an edge of the substrate and at least an edge of the protection member.

2. An organic electroluminescent device according to claim 1, the cover member being disposed adjacent to a filling material which has a gas barrier property.

3. An organic electroluminescent device according to claim 2, the filling material comprising an absorbent.

4. An organic electroluminescent device according to claim 2, the filling material comprising a deoxidizer.

5. An organic electroluminescent device according to claim 2, further comprising a sealing layer formed between the substrate and the protection member, the sealing layer being disposed so as to be in contact with the filling material.

6. An organic electroluminescent device according to claim 1, further comprising:
    a first terminal which is provided on the substrate and is connected to the first electrode; and
    a first conductive member that supplies electric power to the first electrode and is connected to the first terminal, a part of the first conductive member being disposed between an end face of the substrate and the cover member.

7. An organic electroluminescent device according to claim 6, further comprising:
    a second terminal which is provided on the substrate and is connected to the second electrode; and
    a second conductive member that supplies electric power to the second electrode and is connected to the second terminal, a part of the second conductive member being disposed between an end face of the substrate and the cover member.

8. An organic electroluminescent device according to claim 1, further comprising:
    a first wire that supplies electric power to the first electrode and a second wire that supplies electric power to the second electrode; and
    holes formed in the cover member, the first wire and the second wire being disposed so as to pass through the holes.

9. An organic electroluminescent device according to claim 1, the cover member comprising a metal plate.

10. A method for manufacturing an organic electroluminescent device:
    forming on a substrate a laminate comprising a first electrode, a light-emitting layer, and a second electrode;
    attaching a protection member to the substrate so as to place the laminate between the protection member and the substrate; and
    attaching a cover member having a gas barrier property so that the cover member covers at least an edge of the substrate and at least an edge of the protection member.

11. A method for manufacturing an organic electroluminescent device according to claim 10, further comprising providing a filling material having a gas barrier property between the cover member and end faces of the substrate.

12. A method for manufacturing an organic electroluminescent device according to claim 11, further comprising:

providing a material to be used as the filling material on the cover member before disposing the cover member at end face sides of the substrate, the cover member being disposed so that the material opposes end face sides of the substrate.

13. A method for manufacturing an organic electroluminescent device according to claim 11, further comprising:

forming a sealing layer between the substrate and the protection member and at least on the periphery of the substrate, the cover member being disposed so that the filling material comes into contact with the sealing layer.

14. A method for manufacturing an organic electroluminescent device according to claim 10, further comprising:

forming on the substrate a first terminal connected to the first electrode; and connecting to the first terminal a first conductive member that supplies electric power to the first electrode, the first conductive member being provided between an end face of the substrate and the cover member while a part of the first conductive member is being bent.

15. An electronic apparatus comprising an organic electroluminescent device, the organic electroluminescent device comprising:

a substrate;

a protection member;

a laminate comprising a first electrode, a light-emitting layer, and a second electrode the laminate being disposed between the substrate and the protection member; and a cover member which has a gas barrier property and covers at least an edge of the substrate and at least an edge of the protection member.

* * * * *